United States Patent
Jan et al.

(10) Patent No.: US 11,599,157 B2
(45) Date of Patent: Mar. 7, 2023

(54) HINGE MODULE AND ELECTRONIC DEVICE

(71) Applicants: Cheng-Shiue Jan, Taipei (TW); Jyh-Chyang Tzou, Taipei (TW); I Ta Tsai, Taipei (TW); Meng Ju Wu, Taipei (TW)

(72) Inventors: Cheng-Shiue Jan, Taipei (TW); Jyh-Chyang Tzou, Taipei (TW); I Ta Tsai, Taipei (TW); Meng Ju Wu, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 17/027,716

(22) Filed: Sep. 22, 2020

(65) Prior Publication Data

US 2021/0325938 A1 Oct. 21, 2021

Related U.S. Application Data

(60) Provisional application No. 63/010,694, filed on Apr. 16, 2020.

(51) Int. Cl.
*G06F 1/16* (2006.01)
*H05K 5/02* (2006.01)

(52) U.S. Cl.
CPC .......... *G06F 1/1681* (2013.01); *G06F 1/1618* (2013.01); *G06F 1/1624* (2013.01); *H05K 5/0226* (2013.01)

(58) Field of Classification Search
None
See application file for complete search history.

(56) References Cited

U.S. PATENT DOCUMENTS

| | | | | |
|---|---|---|---|---|
| 2015/0227175 A1* | 8/2015 | Motosugi | .............. | G06F 1/1681 16/341 |
| 2017/0068285 A1* | 3/2017 | Park | ...................... | G06F 1/1681 |
| 2019/0204878 A1* | 7/2019 | Lin | ...................... | G06F 1/1616 |
| 2020/0064884 A1* | 2/2020 | Liu | ...................... | G06F 1/1662 |
| 2020/0117284 A1* | 4/2020 | Kulkarni | ............... | G06F 1/1649 |
| 2021/0064096 A1* | 3/2021 | Channaiah | ............ | G06F 1/1616 |
| 2022/0075429 A1* | 3/2022 | Hazama | ................ | G06F 1/1681 |

* cited by examiner

*Primary Examiner* — James Wu
*Assistant Examiner* — Christopher L Augustin
(74) *Attorney, Agent, or Firm* — JCIPRNET

(57) ABSTRACT

A hinge module is provided, including a positioning assembly, a first shaft, a second shaft, a first bracket, a second bracket, and a switching assembly. The first shaft has a first rotating part and a first installing part. The first rotating part is rotatably disposed through the positioning assembly. The second shaft has a second rotating part and a second installing part. The second rotating part is rotatably disposed through the positioning assembly. The first bracket is disposed on the first installing part of the first shaft. The second bracket is disposed on the second installing part of the second shaft. The switching assembly is movably disposed in the positioning assembly and abuts between the first shaft and the second shaft. The hinge module is adapted to switch between a closed state, a first unfolded state, and a second unfolded state.

38 Claims, 12 Drawing Sheets

HINGE MODULE AND ELECTRONIC DEVICE

CROSS-REFERENCE TO RELATED APPLICATION

This application claims the priority benefit of U.S. provisional application Ser. No. 63/010,694, filed on Apr. 16, 2020. The entirety of the above-mentioned patent application is hereby incorporated by reference herein and made a part of this specification.

BACKGROUND

Technical Field

The disclosure relates to a hinge module; particularly, the disclosure relates to a hinge module applied to an electronic device.

Description of Related Art

The existing hinge module is often applied to notebook computers. The hinge module is connected between the main body and the display body of the notebook computer, so that the main body and the display body can be unfolded or closed relative to each other to be switched to a working mode or a received mode. However, in order to achieve the purpose of flipping the notebook computer, a gap is required to be reserved between the main body and the display body to avoid interference between the main body and the display body during flipping.

When the notebook computer is switched to the working mode and an angle formed between the display body and the main body is greater than 90 degrees, the display body will be far away from the user and its center of gravity will be shifted toward the rear side, which results in problems of a tendency to fall and of occupation of relatively large space.

SUMMARY

The disclosure provides a hinge module that has a two-stage unfolding effect and is configured to be combined with an electronic device. When the electronic device is unfolded, its screen can be suspended above the main body to achieve shortening the distance from the user.

In the disclosure, the hinge module includes a positioning assembly, a first shaft, a second shaft, a first bracket, a second bracket, and a switching assembly. The first shaft has a first rotating part and a first installing part. The first rotating part is rotatably disposed through the positioning assembly. The second shaft has a second rotating part and a second installing part. The second rotating part is rotatably disposed through the positioning assembly. The first bracket is disposed in the first installing part of the first shaft. The second bracket is disposed in the second installing part of the second shaft. The switching assembly is movably disposed in the positioning assembly and located between the first shaft and the second shaft. In a closed state, the first bracket is parallel to the second bracket. In a first unfolded state, the second shaft drives the positioning assembly to rotate relative to the first shaft through the switching assembly, so that a first angle is present between the first bracket and the second bracket. In a second unfolded state, the second shaft rotates relative to the positioning assembly and propels the switching assembly, so that a second angle is present between the first bracket and the second bracket.

In the disclosure, the electronic device includes a first body, a second body, a hinge cover, and two hinge modules. The first body has a first groove. The second body has a second groove. The hinge cover is disposed between the first groove and the second groove. The two hinge modules are respectively disposed on two opposite ends of the hinge cover. The hinge modules each include a positioning assembly, a first shaft, a second shaft, a first bracket, a second bracket, and a switching assembly. The first shaft has a first rotating part and a first installing part. The first rotating part is rotatably disposed through the positioning assembly. The second shaft has a second rotating part and a second installing part. The second rotating part is rotatably disposed through the positioning assembly. The first bracket is disposed in the first installing part of the first shaft and is connected to the first body. The second bracket is disposed in the second installing part of the second shaft and is connected to the second body. The switching assembly is movably disposed in the positioning assembly and located between the first shaft and the second shaft. In a closed state, the first body is parallel to the second body. In a first unfolded state, the second shaft drives the positioning assembly and the hinge cover to rotate relative to the first shaft through the switching assembly, so that a first angle is present between the first body and the second body. In a second unfolded state, the second body drives the second shaft to rotate relative to the positioning assembly and the hinge cover, so that a second angle is present between the first body and the second body and the second body is suspended above the first body.

Based on the foregoing, in the disclosure, the hinge module has the first shaft and the second shaft. In the first unfolded state, the second shaft and the switching assembly drive the positioning assembly to rotate relative to the first shaft, so that the first bracket and the second bracket are unfolded relative to each other to the first angle. Next, in the second unfolded state, since the positioning assembly is restricted by the first shaft, the second shaft rotates relative to the positioning assembly and propels the switching assembly, so that the second bracket continues to rotate and the second angle is formed between the same and the first bracket.

Moreover, in the disclosure, the first body and the second body of the electronic device are respectively connected to the corresponding first bracket and second bracket. When the first body and the second body are switched to the second unfolded state, the second body is suspended above the main body, and its position and the center of gravity of the second body are adjusted in a direction toward the user. Compared with existing notebook computers, the distance between the second body and the user can be slightly shortened. In addition, shifting the center of gravity forward reduces the tendency to fall backward of the electronic device in the unfolded state.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
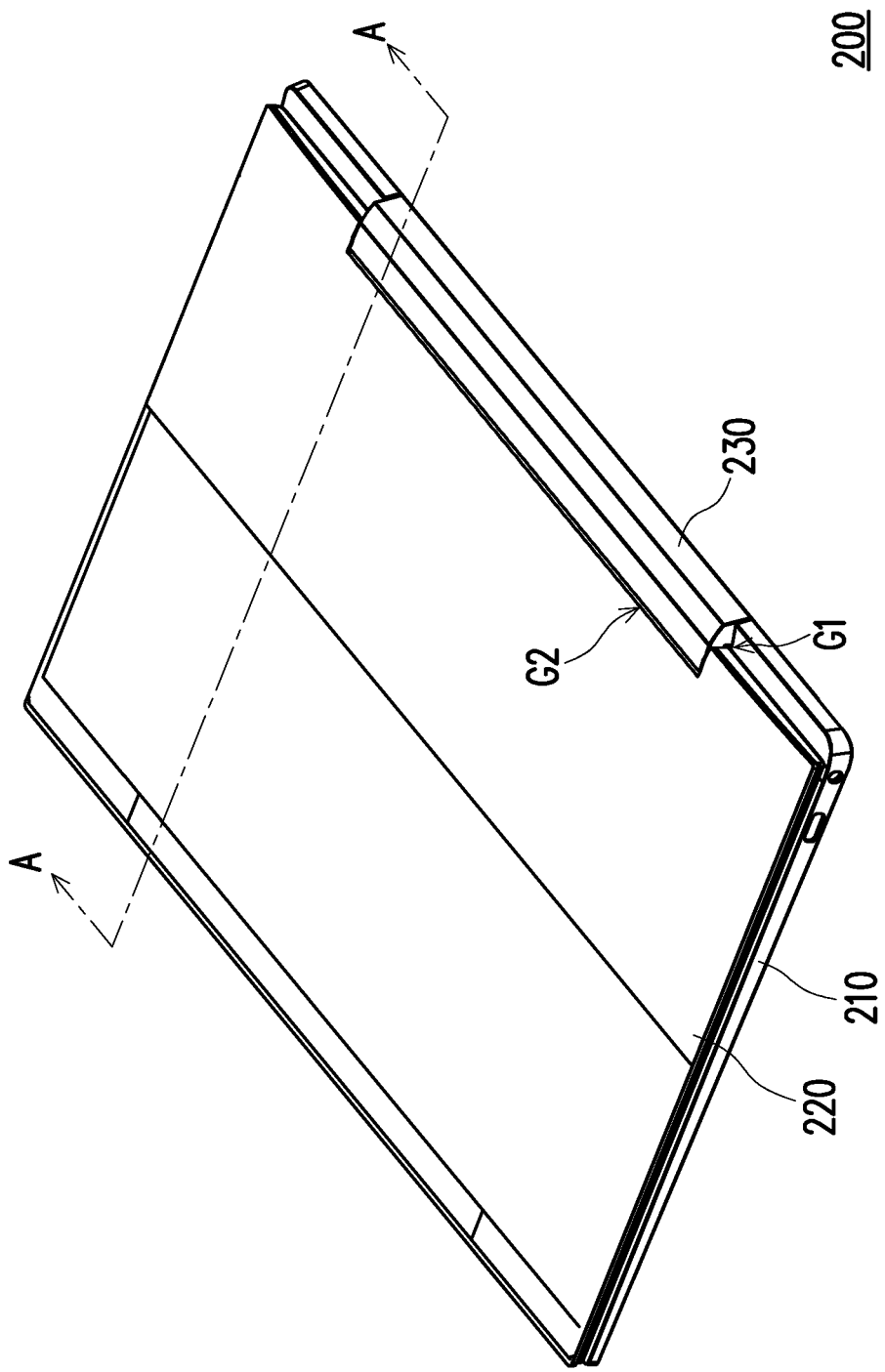
FIG. 1A is a three-dimensional schematic diagram of a closed state of an electronic device according to an embodiment of the disclosure.

FIG. 1A is a three-dimensional schematic diagram of a closed state of an electronic device according to an embodiment of the disclosure. FIG. 11B is a schematic planar diagram of a first unfolded state of the electronic device of FIG. 1A. FIG. 1C is a schematic planar diagram of a second unfolded state of the electronic device of FIG. 1A. FIG. 1D is a three-dimensional schematic diagram of a hinge cover and two hinge modules of the electronic device of FIG. 1A.

Figure 1B:
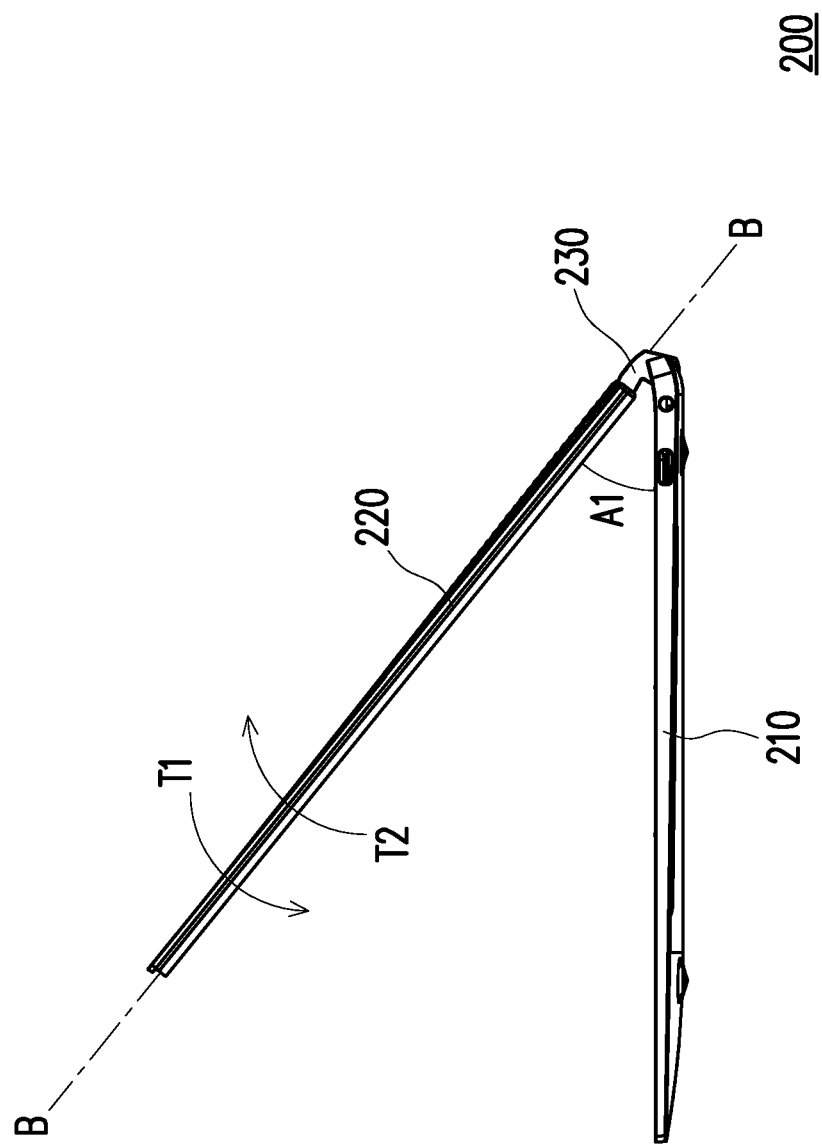
FIG. 1B is a schematic planar diagram of a first unfolded state of the electronic device of FIG. 1A.
Figure 1C:
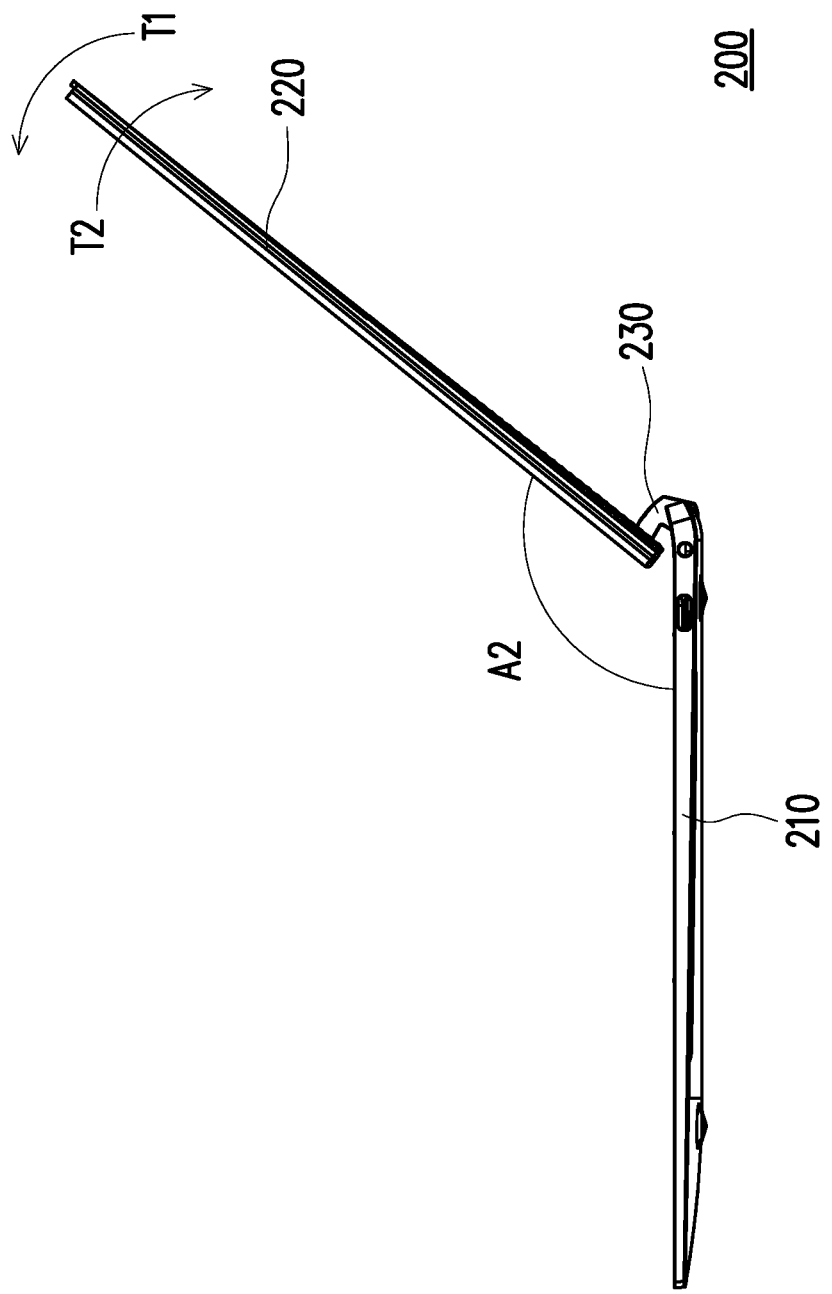
FIG. 1C is a schematic planar diagram of a second unfolded state of the electronic device of FIG. 1A.
Figure 1D:
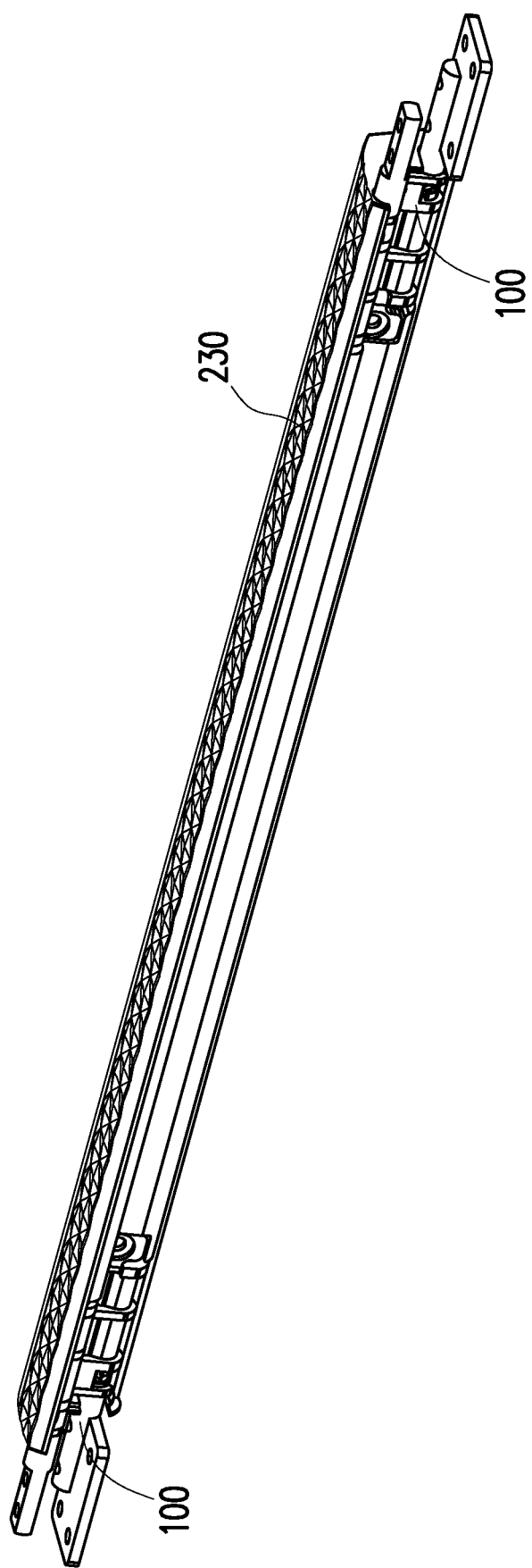
FIG. 1D is a three-dimensional schematic diagram of a hinge cover and two hinge modules of the electronic device of FIG. 1A.

With reference to FIG. 1A to FIG. 1D, a hinge module 100 of the disclosure is suitable for an electronic device 200. The electronic device 200 is, for example, a notebook computer, a tablet computer, or another similar product, and the electronic device 200 includes a first body 210, a second body 220, a hinge cover 230, and two hinge modules 100. The first body 210 has a first groove G1. The second body 220 has a second groove G2. The hinge cover 230 is disposed between the first groove G1 and the second groove G2, and the hinge cover 230 has, for example, an L-shaped appearance. With reference to FIG. 1A and FIG. 1B, in the closed state and the first unfolded state of the electronic device 200, one end of the hinge cover 230 is received in the second groove G2 of the second body 220. With reference to FIG. 1C, in the second unfolded state of the electronic device 200, the second body 220 rotates relative to the one end of the hinge cover 230 and an angle is present therebetween. The two hinge modules 100 are respectively disposed at two opposite ends of the hinge cover 230, and the hinge modules 100 are each connected to the first body 210 and the second body 220. Therefore, the first body 210 and the second body 220 are adapted to be unfolded and closed relative to each other through each of the hinge modules 100.

Figure 2A:
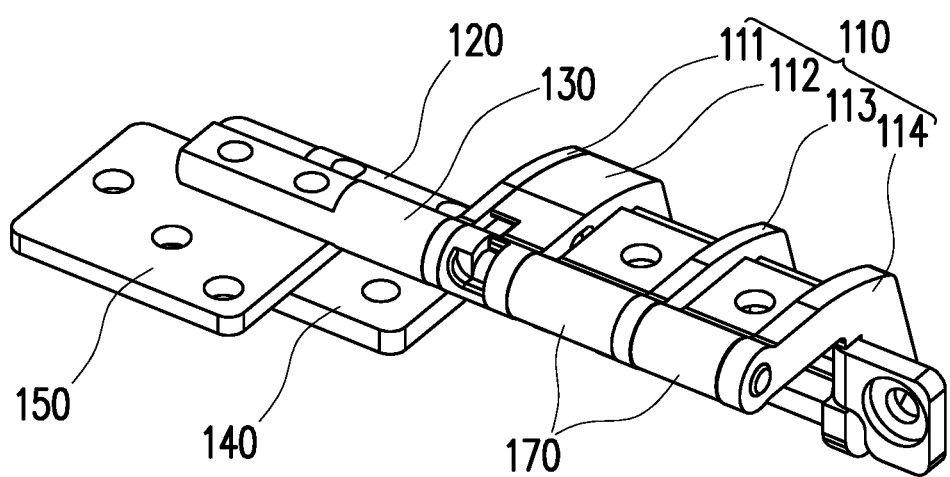
FIG. 2A is a three-dimensional assembly diagram of a hinge module according to an embodiment of the disclosure.
Figure 2B:
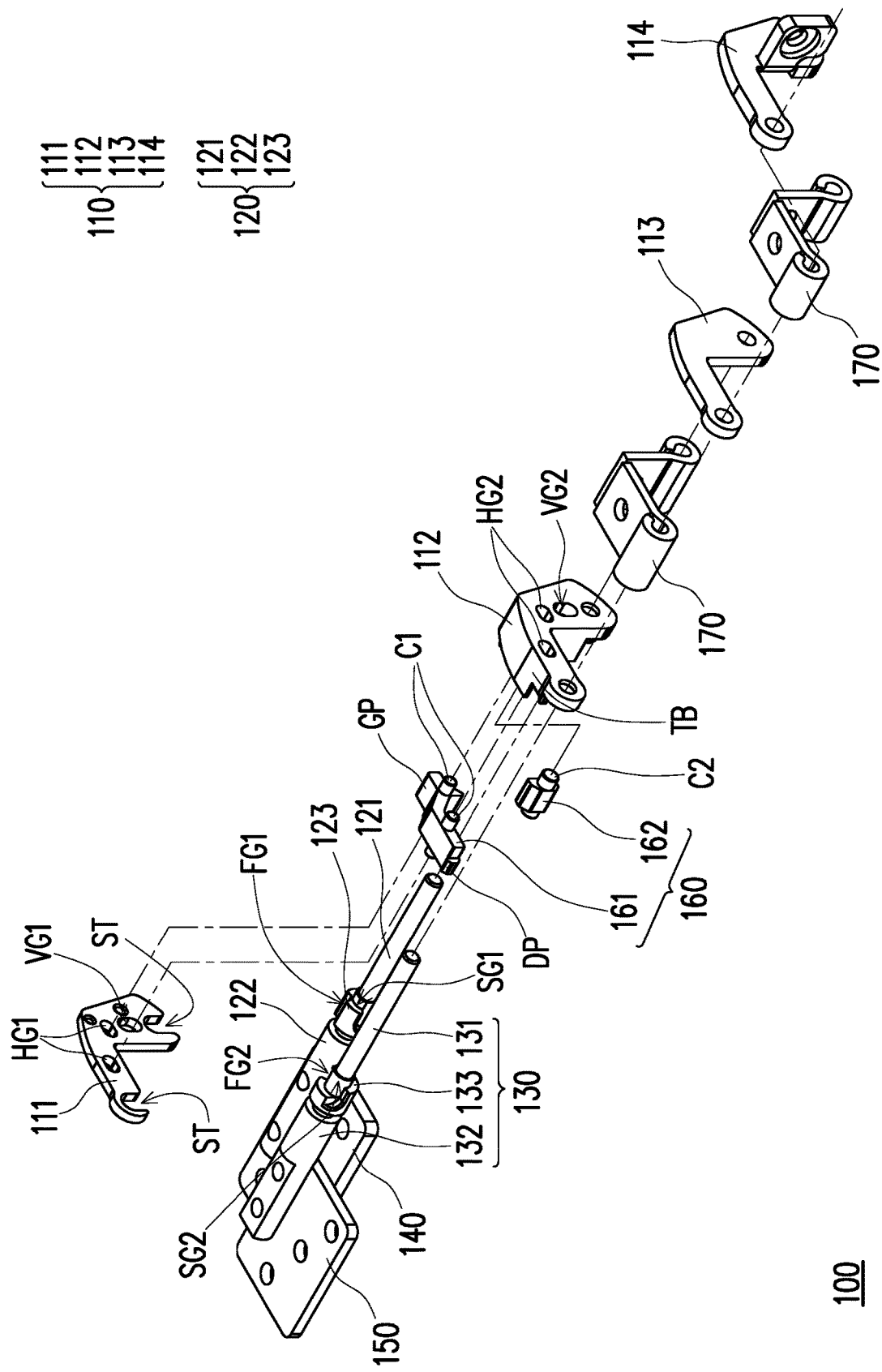
FIG. 2B is an exploded diagram of elements of the hinge module of FIG. 2A.
Figure 2C:
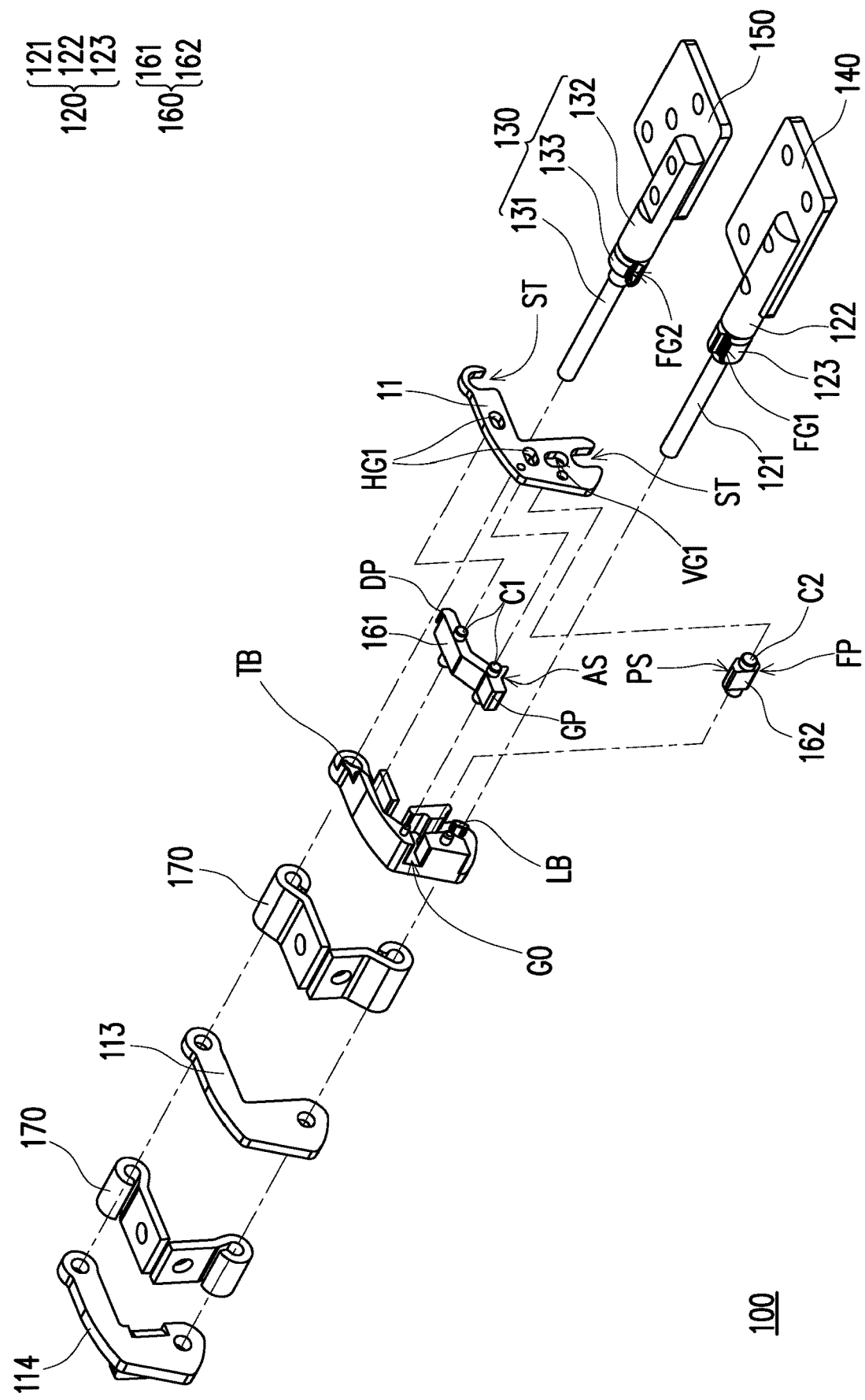
FIG. 2C is an exploded diagram of elements of the hinge module of FIG. 2B from another perspective.

FIG. 2A is a three-dimensional assembly diagram of a hinge module according to an embodiment of the disclosure. FIG. 2B is an exploded diagram of elements of the hinge module of FIG. 2A. FIG. 2C is an exploded diagram of elements of the hinge module of FIG. 2B from another perspective.

With reference to FIG. 2A to FIG. 2C, the hinge modules 100 each includes a positioning assembly 110, a first shaft 120, a second shaft 130, a first bracket 140, a second bracket 150, a switching assembly 160, and two torque members 170. The positioning assembly 110 has a first positioning bracket 111, a second positioning bracket 112, a third positioning bracket 113, and a fourth positioning bracket 114 which are spaced apart from each other.

The first shaft 120 has a first rotating part 121, a first installing part 122, and a first actuating part 123. The first rotating part 121 is rotatably disposed through the first positioning bracket 111, the second positioning bracket 112, the third positioning bracket 113, and the fourth positioning bracket 114 of the positioning assembly 110. The first installing part 122 is formed on a side of the first shaft 120 opposite to the first rotating part 121. The first actuating part 123 is disposed between the first rotating part 121 and the first installing part 122, a first sliding groove SG1 and a first engaging slot FG1 are formed on the first actuating part 123, and a gap is formed between the first actuating part 123 and the first installing part 122.

The second shaft 130 has a second rotating part 131, a second installing part 132, and a second actuating part 133. The second rotating part 131 is rotatably disposed through the first positioning bracket 111, the second positioning bracket 112, the third positioning bracket 113, and the fourth positioning bracket 114 of the positioning assembly 110. The second installing part 132 is formed on a side of the second shaft 130 opposite to the second rotating part 131. The second actuating part 133 is disposed between the second rotating part 131 and the second installing part 132, a second sliding groove SG2 and a second engaging slot FG2 are formed on the second actuating part 133, and a gap is formed between the second actuating part 133 and the second installing part 132.

With reference to FIG. 1D and FIG. 2B, the first shaft 120 and the second shaft 130 are parallel to each other, and the second shaft 130 is suspended above the first body 210.

The first bracket 140 is disposed on the first installing part 122 of the first shaft 120 and is connected to the first body 210. The second bracket 150 is disposed on the second installing part 132 of the second shaft 130 and is connected to the second body 220. In this embodiment, the first bracket 140 and the second bracket 150 are integrally connected respectively with the first installing part 122 and the second installing part 132 through a locking member.

Figure 2D:
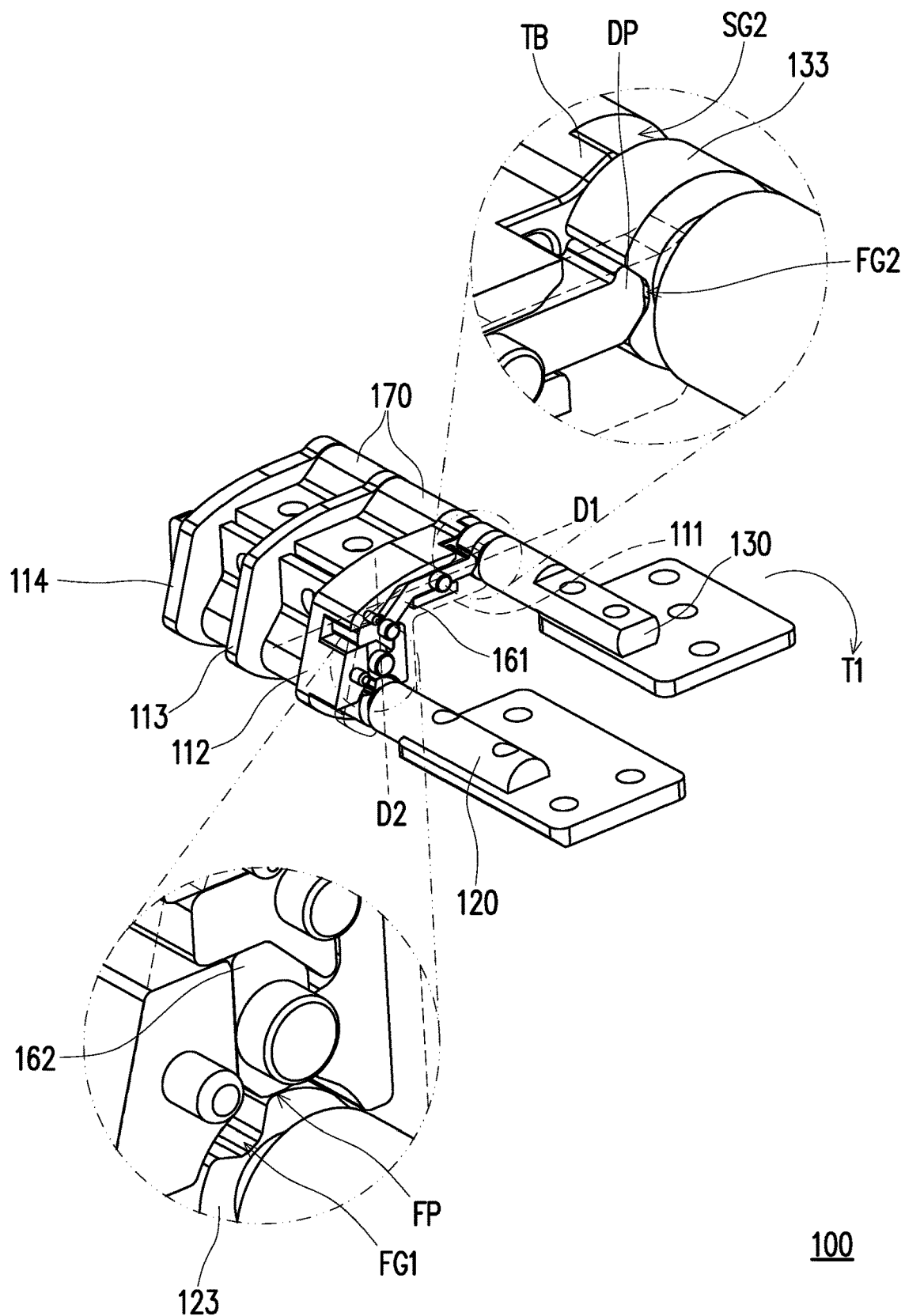
FIG. 2D is a three-dimensional schematic diagram of the hinge module of FIG. 2A in the closed state.
Figure 2E:
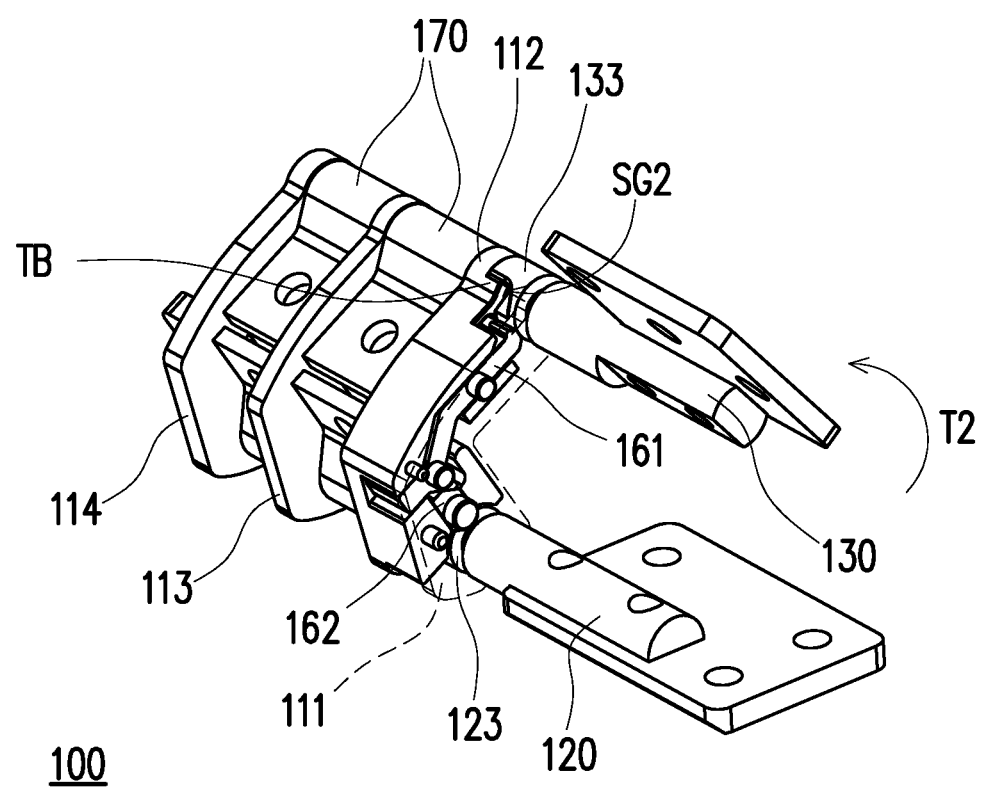
FIG. 2E is a three-dimensional schematic diagram of the hinge module of FIG. 2A in a second unfolded state.

FIG. 2D is a three-dimensional schematic diagram of the hinge module of FIG. 2A in the closed state. FIG. 2E is a three-dimensional schematic diagram of the hinge module of FIG. 2A in a second unfolded state.

With reference to FIG. 2D and FIG. 2E, the switching assembly 160 is movably disposed between the first positioning bracket 111 and the second positioning bracket 112 of the positioning assembly 110, and has two ends that respectively abut the first shaft 120 and the second shaft 130.

The two torque members 170 are sleeved on the first rotating part 121 and the second rotating part 131 to provide a torque for rotation to the first shaft 120 and the second shaft 130. When the first shaft 120 and second shaft 130 are stationary, static friction is present between the two torque members 170, and the first rotating part 121 and the second rotating part 131, which prevents the first shaft 120 and the second shaft 130 from rotating easily. With reference to FIG. 1D, FIG. 2D, and FIG. 2E, one of the torque members 170 is located between the second positioning bracket 112 and the third positioning bracket 113, and the other torque member 170 is adjacent to the third positioning bracket 113 and the fourth positioning bracket 114.

With reference to FIG. 2A to FIG. 2C, the first positioning bracket 111 of the positioning assembly 110 has two sleeve openings ST, which are respectively sleeved on the first shaft 120 and the second shaft 130, and which are respectively adjacent to the first actuating part 123 and the second actuating part 133. Thereby, the first shaft 120 and the second shaft 130 are adapted to rotate relative to each other in the two sleeve openings ST. The second positioning bracket 112 is sleeved on the first rotating part 121 and the second rotating part 131. A lower blocking piece LB and an upper blocking piece TB of the second positioning bracket 112 are slidably disposed respectively in the first sliding groove SG1 of the first actuating part 123 and the second sliding groove SG2 of the second actuating part 133.

The lower blocking piece LB is fixed on the second positioning bracket 112 and is adapted to slide along the first sliding groove SG1. Herein, the first shaft 120 is fixed, and the second positioning bracket 112 is adapted to drive the lower blocking piece LB to slide relative to the first actuating part 123.

The upper blocking piece TB is fixed on the second positioning bracket 112 and is adapted to slide along the second sliding groove SG2. When the second shaft 130 rotates, the upper blocking piece TB is fixed, and the second shaft 130 is adapted to drive the second actuating part 133 to slide relative to the upper blocking piece TB. The third positioning bracket 113 is sleeved on the first rotating part 121 and the second rotating part 131 and is spaced apart from the second positioning bracket 112.

With reference to FIG. 2A to FIG. 2D, the switching assembly 160 has a pushing lever 161 and a sliding piece 162. The pushing lever 161 abuts against the second actuating part 133, the sliding piece 162 abuts against the first actuating part 123, and the pushing lever 161 and the sliding piece 162 abut each other. The pushing lever 161 is adapted to slide relative to the first positioning bracket 111 and the second positioning bracket 112 along a first direction D1, so that the sliding piece 162 slides relative to the first positioning bracket 111 and the second positioning bracket 112 along a second direction D2. Herein, an angle is present between the first direction D1 and the second direction D2, which may be, for example, perpendicular to each other.

To be specific, the pushing lever 161 has an driving part DP, a guiding part GP, and an active inclined surface AS. The driving part DP is formed at one end of the pushing lever 161 that abuts against the second actuating part 133, and the guiding part GP is formed at the other end of the pushing lever 161 that is away from the second actuating part 133. The active inclined surface AS is formed at the other end of the pushing lever 161 and is adjacent to the guiding part GP. The sliding piece 162 has a passive inclined surface PS and an engaging portion FP. The active inclined surface AS and the passive inclined surface PS are in contact with each other. The engaging portion FP abuts against the first actuating part 123.

With reference to FIG. 2A to FIG. 2D, the first positioning bracket 111 has two first direction grooves HG1 and a second direction groove VG1. Herein, one of the first direction grooves HG1 is close to the second shaft 130, and the second direction groove VG1 is close to the first shaft 120. The second positioning bracket 112 has two first direction grooves HG2, a second direction groove VG2, and a guiding hole GO. Each of the first direction grooves HG2 and second direction groove VG2 are respectively aligned with the corresponding first direction groove HG1 and the second direction groove VG1. The guiding hole GO penetrates both sides of the second positioning bracket 112 and is configured to accommodate the guiding part GP of the pushing lever 161.

With reference to FIG. 2D and FIG. 2E, a plurality of pillars C1 of the pushing lever 161 are slidably disposed in the two first direction grooves HG1 and the two first direction grooves HG2. Therefore, the plurality of pillars C1 of the pushing lever 161 are adapted to slide in the two first direction grooves HG1 and the two first direction grooves HG2 along the first direction D1, and at the same time the guiding part GP of the pushing lever 161 also slides in the guiding hole GO along the first direction D1. Two pillars C2 of the sliding piece 162 are slidably disposed in the second direction groove VG1 and the second direction groove VG2. The two pillars C2 are adapted to slide in the second direction groove VG1 and the second direction groove VG2 along the second direction D2.

Figure 3A:
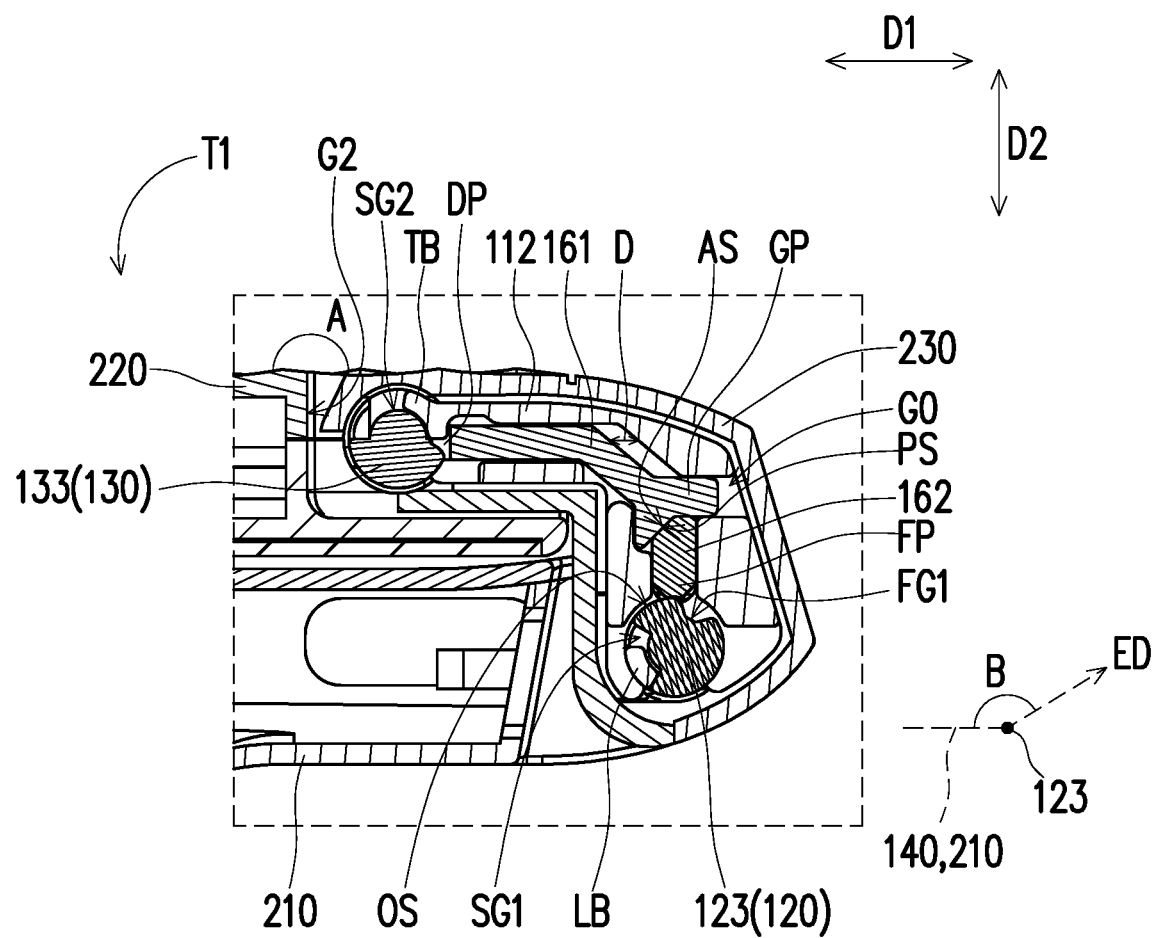
FIG. 3A is a schematic cross-sectional view of the electronic device in FIG. 1A along line A-A.
Figure 3B:
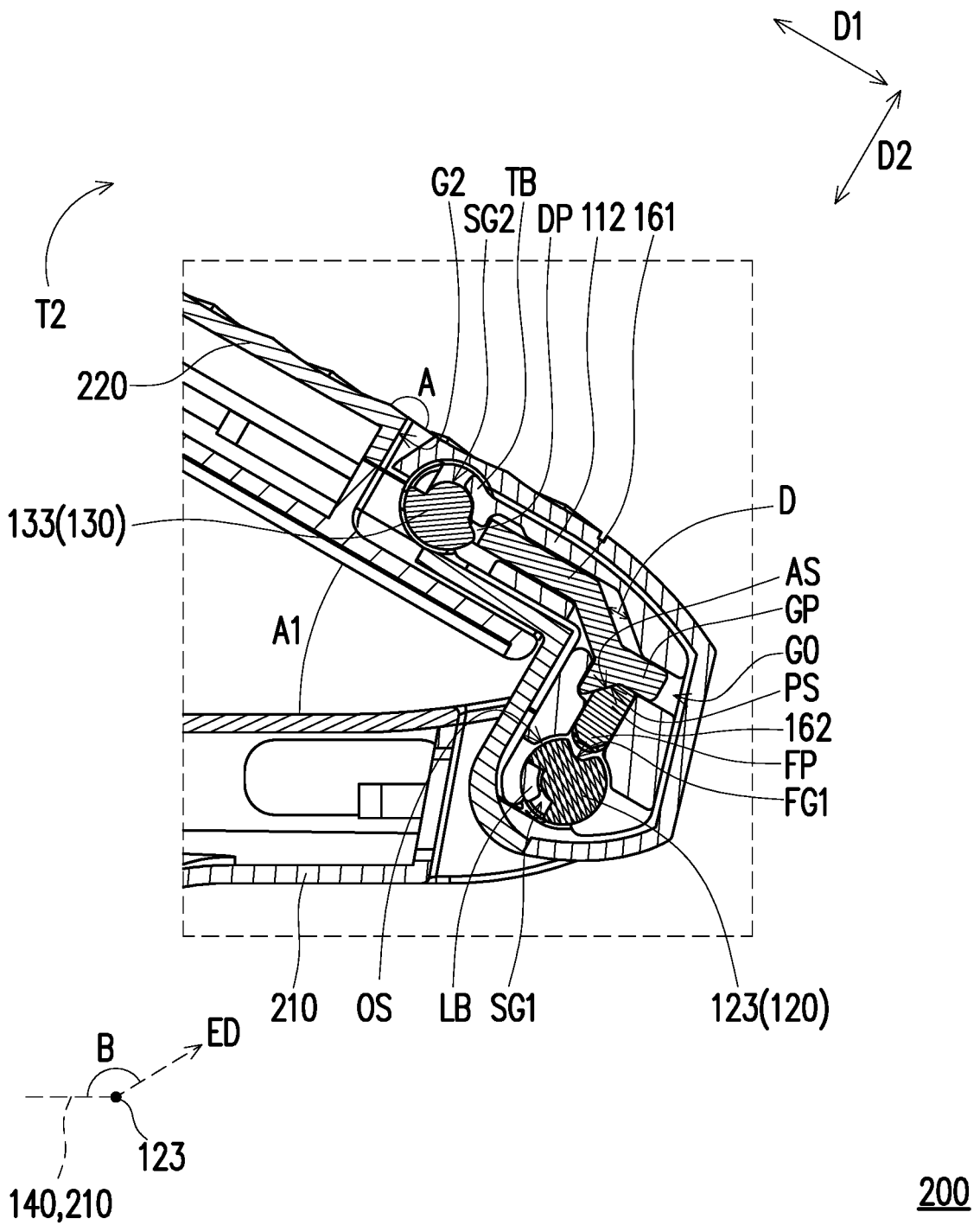
FIG. 3B is a schematic cross-sectional view of the electronic device of FIG. 1B along line B-B.
Figure 3C:
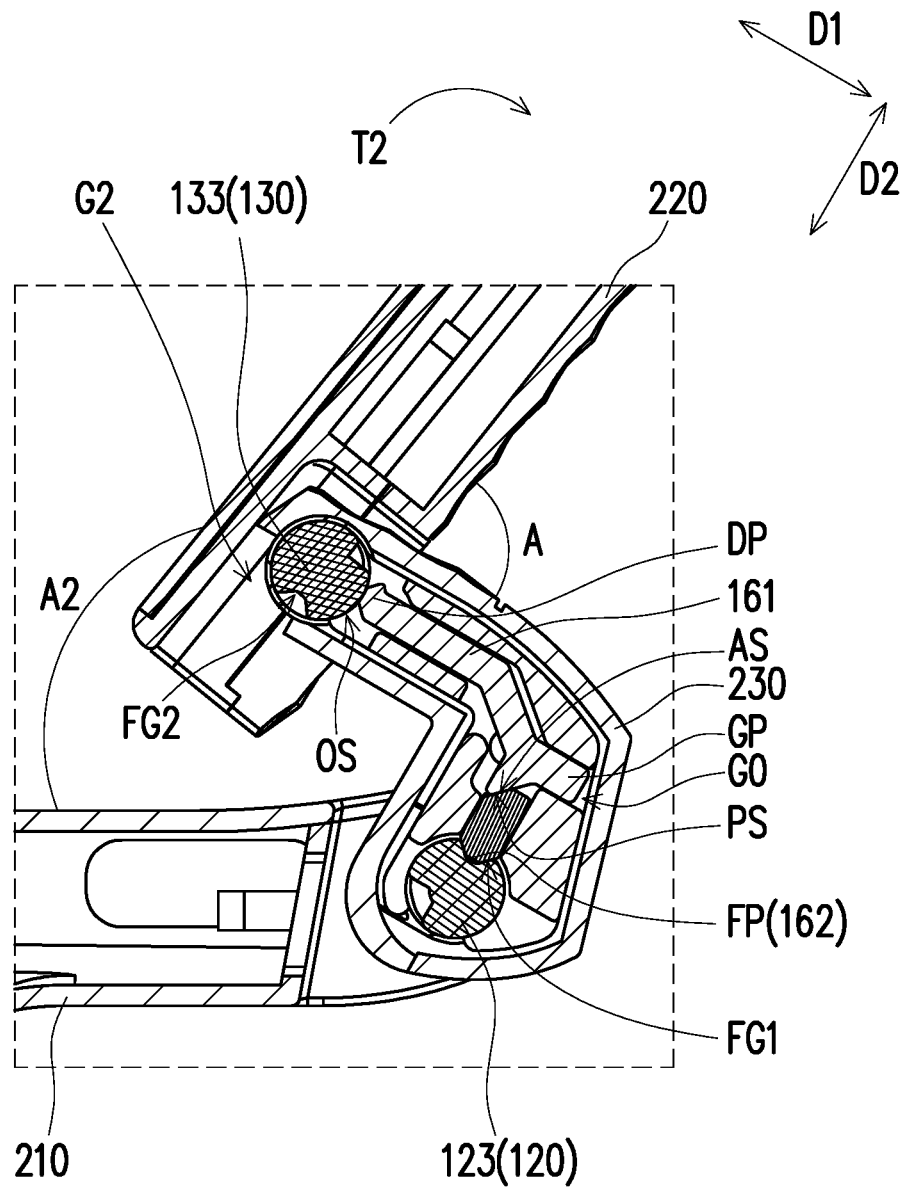
FIG. 3C is a schematic cross-sectional view of the electronic device of FIG. 1C.

FIG. 3A is a schematic cross-sectional view of the electronic device in FIG. 1A along line A-A. FIG. 3B is a schematic cross-sectional view of the electronic device of FIG. 1B along line B-B. FIG. 3C is a schematic cross-sectional view of the electronic device of FIG. 1C along line C-C.

With reference to FIG. 1A, FIG. 2D, and FIG. 3A, in the closed state, the second body 220, after rotating in a first rotation direction T1, is parallel to the first body 210, and the one end of the hinge cover 230 is received in the second groove G2. At this time, an angle A between the second body 220 and the hinge cover 230 is 180 degrees. The driving part DP of the pushing lever 161 is engaged with the second engaging slot FG2 of the second actuating part 133, and a distance D from the second positioning bracket 112 is present. At the same time, the engaging portion FP of the sliding piece 162 abuts on an outer ring surface OS of the first actuating part 123 and is misaligned with the first engaging slot FG1. An angle B of 120 degrees is present between an extension direction ED of the first engaging slot FG1, and the first bracket 140 and the first body 210. The lower blocking piece LB of the second positioning bracket 112 abuts a side of the first sliding groove SG1 that is away from the engaging portion FP, and the upper blocking piece TB of the second positioning bracket 112 abuts a side of the second sliding groove SG2 that is adjacent to the driving part DP.

With reference to FIG. 1B and FIG. 3B, in the first unfolded state, the angle A between the second body 220 and the hinge cover 230 is still 180 degrees, and the second body 220 drives the hinge cover 230 to unfold relative to the first body 210 taking the first shaft 120 as an axis (to rotate in a second rotation direction T2 opposite to the first rotation direction T1). To be specific, the second body 220 and the second shaft 130 drive the positioning assembly 110 and the hinge cover 230 to rotate relative to the first shaft 120 through the switching assembly 160, so that the first body 210 and the second body 220 have a first angle A1 (e.g., of 30 degrees).

At this time, the driving part DP of the pushing lever 161 is engaged with the second engaging slot FG2 of the second actuating part 133. Therefore, the second shaft 130 and the pushing lever 161 are integrally connected to drive the positioning assembly 110 to rotate relative to the first shaft 120, so that the engaging portion FP of the sliding piece 162 departs from the outer ring surface OS and is aligned with the first engaging slot FG1 of the first actuating part 123. At the same time, the lower blocking piece LB of the second positioning bracket 112 abuts the other side of the first sliding groove SG1 that is close to the engaging portion FP, so that the hinge cover 230 is restricted to a certain point.

With reference to FIG. 1C, FIG. 2E, FIG. 3B, and FIG. 3C, the second body 220, when continuously applying a force and drives the second shaft 130 to rotate relative to the positioning assembly 110 and the hinge cover 230, will be switched from the first unfolded state to the second unfolded state. In the second unfolded state, the first body 210 and the second body 220 have a second angle A2 (e.g., of 130 degrees) and the second body 220 is suspended above the first body 210.

To be specific, in the second unfolded state, the second shaft 130 rotates in the second rotation direction T2 and propels the driving part DP of the pushing lever 161, so that the driving part DP of the pushing lever 161 gradually departs from the second engaging slot FG2 and abuts on the outer ring surface OS of the second actuating part 133. At the same time, the second body 220 rotates in the second rotation direction T2 relative to the hinge cover 230, so that the angle A between the second body 220 and the hinge cover 230 is gradually decreased (as less than 90 degrees). The outer ring surface OS of the second actuating part 133 propels the driving part DP of the pushing lever 161, causing the pushing lever 161 to slide along the first direction D1 and to approach the second positioning bracket 112 to narrow the distance D. The upper blocking piece TB abuts the other side of the second sliding groove SG2 that is away from the driving part DP to restrict the second body 220 to a certain point. At the same time, the guiding part GP gradually slides into the guiding hole GO, and then the active inclined surface AS of the pushing lever 161 propels the passive inclined surface PS of the sliding piece 162, so that the engaging portion FP of the sliding piece 162 slides along the second direction D2 and is engaged with the first engaging slot FG1 of the first actuating part 123.

Briefly, the hinge module of the disclosure has a two-stage switching effect. In the first switching process (the first unfolded state), the second body 220, the hinge cover 230, and the hinge module 100 rotate synchronously to be unfolded relative to the first body 210. The hinge cover 230 and the hinge module 100 adopt an L-shaped structure, so that the second body 220 and the hinge cover 230 can be stacked on each other to receive the hinge cover 230 and the hinge module 100 in the second groove G2, which further prevents interference between the hinge cover 230 and the second body 220 and reduces the size of the unfolded electronic device.

In the second switching process (the second unfolded state), the hinge cover 230 and the positioning assembly 110 are fixed, and the second body 220 drives the second shaft 130 to turn relative to the hinge cover 230, so that the hinge cover 230 and the hinge module 100 are partially separated from the second groove G2. In addition, the pushing lever 161 and the sliding piece 162 of the switching assembly 160 respectively slide toward the first direction D1 and the second direction D2, and finally the second body 220 is suspended above the first body 210.

In summary of the foregoing, in the disclosure, the hinge module has the first shaft and the second shaft. In the first unfolded state, the second shaft and the switching assembly drive the positioning assembly to rotate relative to the first shaft, so that the first bracket and the second bracket are unfolded relative to each other to the first angle. Next, in the second unfolded state, since the positioning assembly is restricted by the first shaft, the second shaft rotates relative to the positioning assembly and propels the switching assembly, so that the second bracket continues to rotate and the second angle is formed between the same and the first bracket.

Moreover, in the disclosure, the first body and the second body of the electronic device are respectively connected to the corresponding first bracket and second bracket. When the first body and the second body are switched to the second unfolded state, the second body is suspended above the main body, and its position and the center of gravity of the second body are adjusted in a direction toward the user. Compared with existing notebook computers, the distance between the second body and the user can be slightly shortened. In addition, shifting the center of gravity forward reduces the tendency to fall backward of the electronic device in the unfolded state and reduces the size of space occupied by the electronic device after being unfolded.

Furthermore, the second body is combined with an L-shaped hinge cover. After being switched to the second unfolded state, the second body rotates relative to the hinge cover and is suspended above the first body. Compared with the existing technology in which the screen and the pivot are integrally connected, in the disclosure, since the second body of the electronic device receives the hinge cover with the second groove, the second body has a smaller bottom boundary size, and the hinge cover can be shielded after the second body is unfolded to achieve the effect of narrow bezel.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A hinge module, comprising:
a first shaft having a first installing part and a first rotating part;
a second shaft having a second installing part and a second rotating part;
a positioning assembly, wherein the first rotating part is rotatably disposed through the positioning assembly, and the second rotating part is rotatably disposed through the positioning assembly, wherein the positioning assembly has a first positioning bracket and a second positioning bracket that is spaced apart from the first positioning bracket, and the positioning assembly has a third positioning bracket spaced apart from the second positioning bracket;
a first bracket disposed on the first installing part of the first shaft;
a second bracket disposed on the second installing part of the second shaft; and
a switching assembly movably disposed in the positioning assembly to be switched between a closed state, a first unfolded state, and a second unfolded state,
wherein the first shaft has a first actuating part disposed between the first rotating part and the first installing part, and the second shaft has a second actuating part disposed between the second rotating part and the second installing part,
wherein the first positioning bracket has two sleeve openings being respectively sleeved on the first shaft and the second shaft, and being respectively adjacent to the first actuating part and the second actuating part, and the second positioning bracket has two openings respectively sleeved on the first rotating part and the second rotating part, wherein the first actuating part has a first sliding groove, and the second actuating part has a second sliding groove, wherein the switching assembly has a pushing lever and a sliding piece abutting each other, the pushing lever is adapted to slide relative to the first positioning bracket and the second positioning bracket along a first direction, and the sliding piece is adapted to be driven by the pushing lever and slide relative to the first positioning bracket and the second positioning bracket along a second direction, wherein the pushing lever has an active inclined surface and the sliding piece has a passive inclined surface in contact with the active inclined surface.

2. The hinge module as described in claim 1, wherein the second positioning bracket has a lower blocking piece and an upper blocking piece slidably disposed respectively in the first sliding groove and the second sliding groove.

3. The hinge module as described in claim 1, wherein the third positioning bracket has two openings respectively sleeved on the first rotating part and the second rotating part.

4. The hinge module as described in claim 3, further comprising a torque member located between the second positioning bracket and the third positioning bracket.

5. The hinge module as described in claim 4, wherein the torque member has two openings respectively sleeved on the first rotating part and the second rotating part.

6. The hinge module as described in claim 3, further comprising a torque member adjacent to the third positioning bracket and a fourth positioning bracket, and being away from the second positioning bracket.

7. The hinge module as described in claim 6, wherein the torque member has two openings respectively sleeved on the first rotating part and the second rotating part.

8. The hinge module as described in claim 1, wherein an angle is present between the second direction and the first direction.

9. The hinge module as described in claim 1, wherein the first positioning bracket has two first direction grooves, and the second positioning bracket also has two first direction grooves.

10. The hinge module as described in claim 9, wherein the pushing lever has a plurality of pillars slidably disposed in the first direction grooves of the first positioning bracket and the first direction grooves of the second positioning bracket.

11. The hinge module as described in claim 1, wherein the first positioning bracket has a second direction groove, and the second positioning bracket also has a second direction groove.

12. The hinge module as described in claim 11, wherein the sliding piece has a plurality of pillars slidably disposed in the second direction groove of the first positioning bracket and the second direction groove of the second positioning bracket.

13. The hinge module as described in claim 1, wherein the sliding piece has an engaging portion corresponding to the first actuating part; and the pushing lever has a driving part corresponding to the second actuating part.

14. The hinge module as described in claim 13, wherein the first actuating part has a first engaging slot corresponding to the engaging portion; and the second actuating part has a second engaging slot corresponding to the driving part.

15. The hinge module as described in claim 14, wherein in the closed state, the first bracket is parallel to the second bracket.

16. The hinge module as described in claim 15, wherein the switching assembly is engaged with the second shaft and abuts against the first shaft.

17. The hinge module as described in claim 16, wherein the driving part is engaged with the second engaging slot; and the engaging portion abuts on the outer ring surface of the first actuating part.

18. The hinge module as described in claim 15, wherein the second positioning bracket has a lower blocking piece and an upper blocking piece;

the upper blocking piece abuts against a side of the second sliding groove adjacent to the driving part; and the lower blocking piece abuts against a side of the first sliding groove away from the engaging portion.

19. The hinge module as described in claim 15, wherein a distance is present between the pushing lever and the second positioning bracket.

20. The hinge module as described in claim 15, wherein an angle of 120 degrees is present between an extension direction of the first engaging slot and the first bracket.

21. The hinge module as described in claim 14, wherein in the first unfolded state, the second shaft drives the positioning assembly to rotate relative to the first shaft through the switching assembly, such that a first angle is present between the first bracket and the second bracket.

22. The hinge module as described in claim 21, wherein the switching assembly is engaged with the second shaft.

23. The hinge module as described in claim 22, wherein the driving part is engaged with the second engaging slot; and the engaging portion is aligned with the first engaging slot.

24. The hinge module as described in claim 21, wherein the second positioning bracket has a lower blocking piece and an upper blocking piece;

the upper blocking piece abuts against a side of the second sliding groove adjacent to the driving part; and the lower blocking piece abuts against a side of the first sliding groove close to the engaging portion.

25. The hinge module as described in claim 21, wherein a distance is present between the pushing lever and the second positioning bracket.

26. The hinge module as described in claim 21, wherein the driving part drives the positioning assembly to rotate relative to the first shaft.

27. The hinge module as described in claim 14, wherein in the second unfolded state, the second shaft rotates relative to the positioning assembly and propels the switching assembly, such that a second angle is present between the first bracket and the second bracket.

28. The hinge module as described in claim 27, wherein the switching assembly abuts against the second shaft and is engaged with the first shaft.

29. The hinge module as described in claim 28, wherein the driving part abuts on an outer ring surface of the second actuating part; and the engaging portion is engaged with the first engaging slot of the first actuating part.

30. The hinge module as described in claim 27, wherein the second actuating part propels the pushing lever to slide along the first direction.

31. The hinge module as described in claim 27, wherein the pushing lever closely abuts against the second positioning bracket.

32. The hinge module as described in claim 27, wherein the active inclined surface propels the passive inclined surface, such that the engaging portion slides along the second direction.

33. The hinge module as described in claim 27, wherein the second positioning bracket has a lower blocking piece and an upper blocking piece;
the upper blocking piece abuts against a side of the second sliding groove adjacent to the driving part; and
the lower blocking piece abuts against a side of the first sliding groove close to the engaging portion.

34. An electronic device, comprising:
a first body;
a hinge module comprising:
   a first shaft having a first installing part and a first rotating part;
   a second shaft having a second installing part and a second rotating part;
   a positioning assembly, wherein the first rotating part is rotatably disposed through the positioning assembly, and the second rotating part is rotatably disposed through the positioning assembly, wherein the positioning assembly has a first positioning bracket and a second positioning bracket that is spaced apart from the first positioning bracket, and the positioning assembly has a third positioning bracket spaced apart from the second positioning bracket;
   a first bracket disposed on the first installing part of the first shaft;
   a second bracket disposed on the second installing part of the second shaft; and
   a switching assembly movably disposed in the positioning assembly to be switched between a closed state, a first unfolded state, and a second unfolded state,
   wherein the first shaft has a first actuating part disposed between the first rotating part and the first installing part, and the second shaft has a second actuating part disposed between the second rotating part and the second installing part,
   wherein the first positioning bracket has two sleeve openings being respectively sleeved on the first shaft and the second shaft, and being respectively adjacent to the first actuating part and the second actuating part, and the second positioning bracket has two openings respectively sleeved on the first rotating part and the second rotating part,
   wherein the first actuating part has a first sliding groove, and the second actuating part has a second sliding groove; and
a second body pivotally connected to the first body through the hinge module;
wherein through the hinge module, the first body and the second body are switched between a closed state, a first unfolded state, and a second unfolded state;
wherein in the first unfolded state, the second body and the hinge module rotate relative to the first body; and
wherein in the second unfolded state, the second body rotates relative to the hinge module and is suspended above the first body,
wherein the switching assembly has a pushing lever and a sliding piece abutting each other, the pushing lever is adapted to slide relative to the first positioning bracket and the second positioning bracket along a first direction, and the sliding piece is adapted to be driven by the pushing lever and slide relative to the first positioning bracket and the second positioning bracket along a second direction,
wherein the pushing lever has an active inclined surface and the sliding piece has a passive inclined surface in contact with the active inclined surface.

35. A hinge module, comprising:
a first shaft having a first installing part;
a second shaft having a second installing part;
a positioning assembly, wherein the positioning assembly has a first positioning bracket and a second positioning bracket that is spaced apart from the first positioning bracket, and the positioning assembly has a third positioning bracket spaced apart from the second positioning bracket;
a first bracket disposed on the first installing part of the first shaft;
a second bracket disposed on the second installing part of the second shaft; and
a switching assembly movably disposed in the positioning assembly to be switched between a closed state, a first unfolded state, and a second unfolded state,
wherein the first positioning bracket has two sleeve openings being respectively sleeved on the first shaft and the second shaft, and being respectively adjacent to a first actuating part of the first shaft and a second actuating part of the second shaft, and the second positioning bracket has two openings respectively sleeved on a first rotating part of the first shaft and a second rotating part of the second shaft,
wherein the switching assembly has a pushing lever and a sliding piece abutting each other, the pushing lever is adapted to slide relative to the first positioning bracket and the second positioning bracket along a first direction, and the sliding piece is adapted to be driven by the pushing lever and slide relative to the first positioning bracket and the second positioning bracket along a second direction,
wherein the pushing lever has an active inclined surface and the sliding piece has a passive inclined surface in contact with the active inclined surface.

36. An electronic device, comprising:
a first body;
a hinge module comprising:
   a positioning assembly, wherein the positioning assembly has a first positioning bracket and a second positioning bracket that is spaced apart from the first positioning bracket, and the positioning assembly has a third positioning bracket spaced apart from the second positioning bracket,
   wherein, the first positioning bracket has two sleeve openings being respectively sleeved on a first shaft and a second shaft, and being respectively adjacent to a first actuating part of the first shaft and a second actuating part of the second shaft, and the second positioning bracket has two openings respectively sleeved on a first rotating part of the first shaft and a second rotating part of the second shaft;
a second body pivotally connected to the first body through the hinge module;
wherein through the hinge module, the first body and the second body are switched between a closed state, a first unfolded state, and a second unfolded state;
wherein in the first unfolded state, the second body and the hinge module rotate relative to the first body; and wherein in the second unfolded state, the second body rotates relative to the hinge module and is suspended above the first body, wherein the switching assembly has a pushing lever and a sliding piece abutting each other, the pushing lever is adapted to slide relative to the first positioning bracket and the second positioning bracket along a first direction, and the sliding piece is adapted to be driven by the pushing lever and slide relative to the first positioning bracket and the second positioning bracket along a second direction, wherein the pushing lever has an active inclined surface and the sliding piece has a passive inclined surface in contact with the active inclined surface.

37. A hinge module, comprising:

a first shaft having a first installing part;

a second shaft having a second installing part;

a positioning assembly, wherein the positioning assembly has a first positioning bracket and a second positioning bracket that is spaced apart from the first positioning bracket, and the positioning assembly has a third positioning bracket spaced apart from the second positioning bracket;

a first bracket disposed on the first installing part of the first shaft;

a second bracket disposed on the second installing part of the second shaft; and a switching assembly movably disposed in the positioning assembly to be switched between a closed state, a first unfolded state, and a second unfolded state, wherein the first positioning bracket has two sleeve openings being respectively sleeved on the first shaft and the second shaft, and being respectively adjacent to a first actuating part of the first shaft and a second actuating part of the second shaft, and the second positioning bracket has two openings respectively sleeved on a first rotating part of the first shaft and a second rotating part of the second shaft, wherein the switching assembly has a pushing lever and a sliding piece abutting each other, the pushing lever is adapted to slide relative to the first positioning bracket and the second positioning bracket along a first direction, wherein the first positioning bracket has two first direction grooves, the second positioning bracket also has two first direction grooves, and the pushing lever has a plurality of pillars slidably disposed in the first direction grooves of the first positioning bracket and the first direction grooves of the second positioning bracket.

38. A hinge module, comprising:

a first shaft having a first installing part;

a second shaft having a second installing part;

a positioning assembly, wherein the positioning assembly has a first positioning bracket and a second positioning bracket that is spaced apart from the first positioning bracket, and the positioning assembly has a third positioning bracket spaced apart from the second positioning bracket;

a first bracket disposed on the first installing part of the first shaft;

a second bracket disposed on the second installing part of the second shaft; and a switching assembly movably disposed in the positioning assembly to be switched between a closed state, a first unfolded state, and a second unfolded state, wherein the first positioning bracket has two sleeve openings being respectively sleeved on the first shaft and the second shaft, and being respectively adjacent to a first actuating part of the first shaft and a second actuating part of the second shaft, and the second positioning bracket has two openings respectively sleeved on a first rotating part of the first shaft and a second rotating part of the second shaft, wherein the switching assembly has a pushing lever and a sliding piece abutting each other, the pushing lever is adapted to slide relative to the first positioning bracket and the second positioning bracket along a first direction, and the sliding piece is adapted to be driven by the pushing lever and slide relative to the first positioning bracket and the second positioning bracket along a second direction, wherein the first positioning bracket has a second direction groove, and the second positioning bracket also has a second direction groove, the sliding piece has a plurality of pillars slidably disposed in the second direction groove of the first positioning bracket and the second direction groove of the second positioning bracket.

* * * * *